(12) United States Patent
Zhao et al.

(10) Patent No.: US 11,298,957 B2
(45) Date of Patent: Apr. 12, 2022

(54) LASER PANEL, LASER ARRAY DEVICE, AND LASER DISPLAY

(71) Applicant: INSTITUTE OF CHEMISTRY, CHINESE ACADEMY OF SCIENCES, Beijing (CN)

(72) Inventors: Yongsheng Zhao, Beijing (CN); Jiannian Yao, Beijing (CN); Jinyang Zhao, Beijing (CN); Yongli Yan, Beijing (CN)

(73) Assignee: INSTITUTE OF CHEMISTRY, CHINESE ACADEMY OF SCIENCES, Beijing (CN)

( * ) Notice: Subject to any disclaimer, the term of this patent is extended or adjusted under 35 U.S.C. 154(b) by 315 days.

(21) Appl. No.: 16/614,763

(22) PCT Filed: May 4, 2018

(86) PCT No.: PCT/CN2018/085671
§ 371 (c)(1),
(2) Date: Nov. 18, 2019

(87) PCT Pub. No.: WO2018/210143
PCT Pub. Date: Nov. 22, 2018

(65) Prior Publication Data
US 2020/0381901 A1 Dec. 3, 2020

(30) Foreign Application Priority Data

May 19, 2017 (CN) .......................... 201710358465.8
May 19, 2017 (CN) .......................... 201710358471.3
(Continued)

(51) Int. Cl.
*H01S 5/40* (2006.01)
*B41J 2/44* (2006.01)
(Continued)

(52) U.S. Cl.
CPC .............. *B41J 2/442* (2013.01); *B41J 3/546* (2013.01); *B41M 3/006* (2013.01);
(Continued)

(58) Field of Classification Search
CPC ... B41J 2/442; B41J 3/546; B41J 2/01; B41M 3/006; B41M 5/0023; B41M 5/0047;
(Continued)

(56) References Cited

U.S. PATENT DOCUMENTS 6,220,912 B1 * 4/2001 Shigeoka ................ H01J 9/027
445/24
8,042,899 B2 10/2011 Folkins et al.
(Continued)

FOREIGN PATENT DOCUMENTS

CN 2727767 Y 9/2005
CN 1876375 A 12/2006
(Continued)

OTHER PUBLICATIONS

Van Duong Ta et al., "Multicolor Lasing Prints", Applied Physics Letters, vol. 107, No. 22, Nov. 30, 2015, pp. 221103-1-221103-4.

*Primary Examiner* — Richard J Hong
(74) *Attorney, Agent, or Firm* — Novick, Kim & Lee, PLLC; Allen Xue

(57) ABSTRACT

A laser panel, a laser array device, and a laser display. The laser panel and the laser array device separately comprise multiple groups of independent laser light source modules; each group of laser light source modules comprises plural light sources; the plural light sources are all produced by inkjet printing; the laser display and a voltage-driven laser display separately comprise the laser panel. Producing a laser panel by inkjet printing provides a novel technical solution for cheap and industrial manufacturing of laser panels. It is difficult to generate laser coherent superposition (Continued)

between the light emitted by the laser light source module, and therefore, speckles caused by laser coherence in conventional laser display technologies are greatly eliminated. The present invention achieves a voltage-driven laser display, and facilitates achieving a better display effect while reducing the volume of the display.

20 Claims, 1 Drawing Sheet

(30) Foreign Application Priority Data

| May 19, 2017 | (CN) | ................... 201710359070.X |
|---|---|---|
| May 19, 2017 | (CN) | ................... 201710359076.7 |
| May 19, 2017 | (CN) | ................... 201710359566.7 |
| May 19, 2017 | (CN) | ................... 201710359567.1 |
| May 19, 2017 | (CN) | ................... 201710359582.6 |
| May 19, 2017 | (CN) | ................... 201710361265.8 |

(51) Int. Cl.

| B41J 3/54 | (2006.01) |
|---|---|
| C09D 11/328 | (2014.01) |
| C09D 11/107 | (2014.01) |
| C09D 11/108 | (2014.01) |
| H01S 5/36 | (2006.01) |
| B41M 3/00 | (2006.01) |
| B41M 5/00 | (2006.01) |
| G09G 3/02 | (2006.01) |

(52) U.S. Cl.
CPC ......... *B41M 5/0023* (2013.01); *C09D 11/107* (2013.01); *C09D 11/108* (2013.01); *C09D 11/328* (2013.01); *G09G 3/02* (2013.01); *H01S 5/36* (2013.01); *H01S 5/4093* (2013.01)

(58) Field of Classification Search
CPC ... B41M 5/0058; B41M 5/007; C09D 11/102; C09D 11/106; C09D 11/107; C09D 11/108; C09D 11/328; C09D 11/50; G02B 27/48; G09G 3/02; H01S 3/0627; H01S 3/094034; H01S 3/168; H01S 3/2391; H01S 5/36; H01L 33/08; H01L 33/005; H01L 51/0069; H01L 51/0077; H01L 51/0035; H01L 25/0753; H01L 51/0058; H01L 51/0005; B82Y 40/00; H01J 9/027

See application file for complete search history.

(56) References Cited

U.S. PATENT DOCUMENTS

| 8,714,692 | B1 | 5/2014 | Metcalfe et al. |
|---|---|---|---|
| 8,955,937 | B2 | 2/2015 | Metcalfe et al. |
| 8,985,723 | B2 | 3/2015 | Metcalfe et al. |
| 9,573,382 | B1 | 2/2017 | Metcalfe et al. |
| 2002/0015800 | A1* | 2/2002 | Miyamoto ................ B41J 2/01 427/553 |
| 2005/0100660 | A1* | 5/2005 | Ito ..................... H01L 51/0005 118/58 |
| 2007/0025409 | A1 | 2/2007 | Yang et al. |
| 2013/0037778 | A1* | 2/2013 | Kazlas .................. H01L 33/005 257/9 |
| 2013/0056705 | A1* | 3/2013 | Kim ........................ B82Y 40/00 257/13 |
| 2016/0218141 | A1* | 7/2016 | Cai ........................ H01L 33/08 |
| 2017/0229429 | A1* | 8/2017 | He ....................... H01L 25/0753 |
| 2018/0151814 | A1* | 5/2018 | Hirose ................ H01L 51/0035 |
| 2018/0182961 | A1* | 6/2018 | Kawakami .......... H01L 51/0058 |
| 2018/0182977 | A1* | 6/2018 | Hirose ................ H01L 51/0077 |
| 2021/0139496 | A1* | 5/2021 | Takeda ............... H01L 51/0069 |

FOREIGN PATENT DOCUMENTS

| CN | 101257185 A | 9/2008 |
|---|---|---|
| CN | 103777453 A | 5/2014 |
| CN | 104253372 A | 12/2014 |

* cited by examiner

LASER PANEL, LASER ARRAY DEVICE, AND LASER DISPLAY

TECHNICAL FIELD

The present invention relates to the field of laser, and specially relates to a laser panel, a laser array device and a laser display.

BACKGROUND ART

For the field of laser displays and laser sources, on the one hand, the current laser display technology, due to laser speckles caused by interference effects of strong coherence of laser which seriously reduces display quality, has to use vibrating screen to eliminate speckles. On the other hand, in prior art, there is a lack of technology for fast and mass-manufacturing of laser panels that are core components of laser displays and enabling each point in the panels to emit laser in different colors. Meanwhile, there is also a lack of technology in prior art for rapid and mass-manufacturing of laser array devices and enabling each point in the laser array devices to emit laser in different colors. Moreover, the laser displays in prior art have large volume and complicated driving.

DETAILED DESCRIPTION OF THE INVENTION

To solve the above problems, the present invention provides a laser panel, which is fabricated by inkjet printing, and realizes cheap and industrial manufacturing of laser panels; and since the laser panel includes multiple independent laser source modules, each set of the laser source modules are independent of each other when emitting light, thereby common speckle phenomena caused by laser coherence is significantly eliminated.

The present invention can be realized by the following technical solutions:

a laser panel, wherein, the laser panel comprises multiple independent laser source modules;

each set of the laser source modules comprises plural light sources;

the plural light sources are all fabricated by inkjet printing.

Preferably, at least two of the plural light sources are capable of emitting light in different colors under the same excitation conditions.

Preferably, each set of the laser source modules excites the plural light sources by a femtosecond laser.

Preferably, the laser panel excites the plural light sources by DC voltage.

Preferably, when the laser panel is used for displaying an image, light emitted by each set of the laser source modules under excitation corresponds to one pixel of the image.

Preferably, each of the plural light sources is on a millimeter scale, or a micrometer scale or an even smaller scale.

Preferably, each set of the laser source modules comprises three light sources, red, green and blue, respectively, i.e., RGB three light sources.

Preferably, ink of the inkjet printing comprises luminescent dyes and matrix materials.

Preferably, the inkjet printing is performed using one or multiple printheads; the printheads are used for sequentially printing, or printing at a time each light source in each set of the laser source modules.

Preferably, sizes of the printheads are determined by a size of each light source.

To solve the above problems, the present invention provides a completely new laser array device. Since the laser array device comprises multiple independent laser source modules, each set of the laser source modules are independent of each other when emitting light, among which it is difficult to generate laser coherent, thereby significantly eliminating common speckle phenomena caused by laser coherence.

The present invention can be realized by the following technical solutions:

a laser array device, wherein, the laser array device comprises multiple independent laser source modules;

each set of the laser source modules comprises plural light sources;

the plural light sources are all fabricated by inkjet printing.

Preferably, at least two of the plural light sources are capable of emitting light in different colors under same excitation conditions.

Preferably, the each set of the laser source modules excites the plural light sources by a femtosecond laser.

Preferably, the laser array device excites the plural light sources by a DC voltage or a pulse voltage.

Preferably, when the laser array device is used for displaying an image, light emitted by the each set of the laser source modules under excitation corresponds to one pixel of the image.

Preferably, each of the plural light sources is on a millimeter scale, or a micrometer scale or an even smaller scale.

Preferably, each set of the laser source modules comprises three monochrome light sources, red, green and blue, respectively, i.e., RGB three light sources.

Preferably, ink of the inkjet printing comprises luminescent dyes and matrix materials.

Preferably, the inkjet printing is performed using one or multiple printheads; the printheads are used for sequentially printing, or printing at a time each light source in each set of the laser source modules.

Preferably, sizes of the printheads are determined by a size of each light source.

Furthermore, the present invention also provides a laser projector, wherein, the laser projector comprises any of the preceding items of the laser array device.

Moreover, the present invention also provides a laser film, wherein, the laser film comprises any of the preceding items of the laser array device.

To solve the above problems, the present invention provides a laser display, which provides a new technical solution for cheap and industrial manufacturing of laser displays; and, due to multiple independent laser source modules, each set of the laser source modules are independent of each other when emitting light, thereby significantly eliminating common speckle phenomena caused by laser coherence.

The present invention can be realized by the following technical solutions:

a laser display, wherein, the laser display comprises a laser panel;

the laser panel comprises multiple independent laser source modules;

each set of the laser source modules comprises plural light sources;

the plural light sources are all fabricated by inkjet printing.

Preferably, at least two of the plural light sources are capable of emitting light in different colors under same excitation conditions.

Preferably, each set of the laser source modules excites the plural light sources by a femtosecond laser.

Preferably, the laser display excites the plural light sources by a DC voltage.

Preferably, when the laser display is used for displaying an image, light emitted by each set of the laser source modules under excitation corresponds to one pixel of the image.

Preferably, each of the plural light sources is on a millimeter scale, or a micrometer scale or an even smaller scale.

Preferably, each set of the laser source modules comprises three light sources, red, green and blue, respectively, i.e., RGB three light sources.

Preferably, ink of the inkjet printing comprises luminescent dyes and matrix materials.

Preferably, the inkjet printing is performed using one or multiple printheads; the printheads are used for sequentially printing, or printing at a time each light source in each set of the laser source modules.

Preferably, sizes of the printheads are determined by a size of each light source.

To solve the above problems, the present invention provides a voltage-driven laser display, which provides a new technical solution for cheap and industrial manufacturing of laser displays; and, due to multiple independent laser source modules, each set of the laser source modules are independent of each other when emitting light, thereby significantly eliminating common speckle phenomena caused laser coherence.

The present invention can be realized by the following technical solutions:

a voltage-driven laser display, wherein, the laser display comprises a laser panel;

the laser panel comprises multiple independent laser source modules;

each set of the laser source modules comprises plural light sources;

the plural light sources are all fabricated by inkjet printing, and can be excited by a DC voltage or a pulse voltage.

Preferably, at least two of the plural light sources are capable of emitting light in different colors under same excitation conditions.

Preferably, the DC voltage is about 3V.

Preferably, each of the plural light sources is independently controlled by the corresponding driving unit.

Preferably, when the laser display is used for displaying an image, light emitted by each set of the laser source modules under excitation corresponds to one pixel of the image.

Preferably, each of the plural light sources is on a millimeter scale, or a micrometer scale or an even smaller scale.

Preferably, each set of the laser source modules comprises three light sources, red, green and blue, respectively, i.e., RGB three light sources.

Preferably, ink of the inkjet printing comprises luminescent dyes and matrix materials.

Preferably, the inkjet printing is performed using one or multiple printheads; the printheads are used for sequentially printing, or printing at a time each light source in each set of the laser source modules.

Preferably, sizes of the printheads are determined by a size of each light source.

Beneficial effects of the present invention:

1. According to many technical solutions provided by the present invention, firstly, it realizes that a laser panel is fabricated by inkjet printing, which provides a new technical solution for cheap and industrial manufacturing of laser panels; secondly, since the laser panel comprises multiple independent laser source modules, each set of the laser source modules are independent of each other when emitting light, among which it is difficult to generate laser coherent superposition, thereby significantly eliminating common speckle phenomena caused by laser coherence.

2. According to the technical solutions provided by the present invention, it realizes that a laser array device is fabricated by inkjet printing, which provides a new technical solution for cheap and industrial manufacturing of laser array devices; secondly, since the laser array device comprises multiple independent laser source modules, each set of the laser source modules are independent of each other when emitting light, among which it is difficult to generate laser coherent, thereby significantly eliminating common speckle phenomena caused by laser coherence.

3. According to many technical solutions provided by the present invention, firstly, it realizes that a laser panel that is a core component of a laser display is fabricated by inkjet printing, which provides a new technical solution for cheap and industrial manufacturing of laser displays; secondly, because of multiple independent laser source modules, each set of the laser source modules are independent of each other when emitting light, thus, among which it is difficult to generate laser coherent superposition, thereby significantly eliminating common speckle phenomena caused by laser coherence.

4. According to many technical solutions provided by the present invention, firstly, it realizes that a laser panel that is a core component of a voltage-driven laser display is fabricated by inkjet printing, which provides a new technical solution for cheap and industrial manufacturing of laser displays; secondly, because of multiple independent laser source modules, each set of the laser source modules are independent of each other when emitting light, thus, among which it is difficult to generate laser coherent superposition, thereby significantly eliminating common speckle phenomena caused by laser coherence.

EMBODIMENTS

To help those skilled in the art understand the technical solutions disclosed in the present invention, hereinafter, with reference to the embodiments and the accompanying drawings, technical solutions of every embodiment are described. The described embodiments are a part of the embodiments of the present invention, rather than all of the embodiments. Furthermore, the terms such as "first", "second", etc., in the present invention are used to distinguish different objects, and not meant to describe a specific order. Moreover, "including" and "having" and any variations thereof are intended to be inclusive and not exclusive. For example, processes, methods, systems, products, or devices that include a series of steps or units are not limited to the listed steps or units, but optionally include unlisted steps or units, or optionally also include other inherent steps or units in these processes, methods, systems, products, or devices.

"Embodiments" mentioned herein means that the accompanying specific features, structures, or characteristics described in the embodiments can be included in at least one embodiment of the present invention. The phrase appearing in various places in the description is neither necessarily referred to the same embodiments, nor independent or alternative embodiments that are mutually exclusive from other embodiments. Those skilled in the art can understand that the embodiments described herein can be combined with other embodiments.

Figure 1:
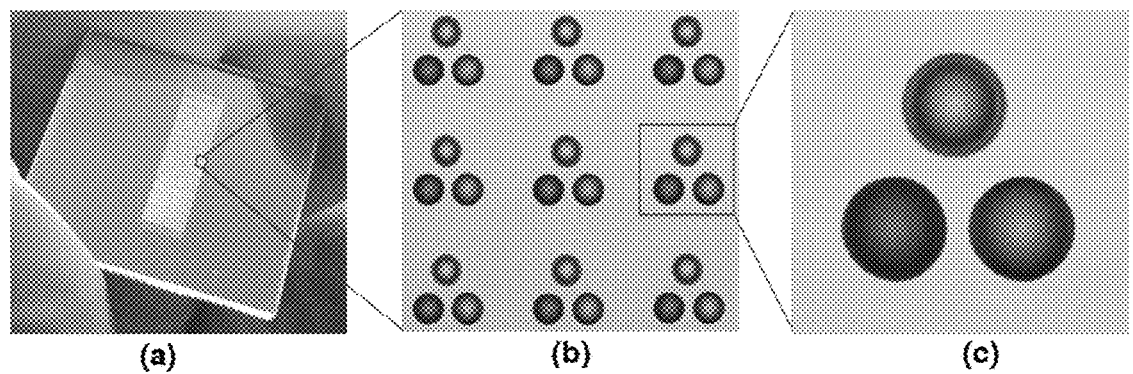
FIG. 1 is a schematic view of a laser panel or a laser array device in an embodiment of the present invention.

Referring to (b) and (c) in FIG. 1, in an embodiment of the present invention, a laser panel is shown, wherein, the laser panel is used for laser display; the laser panel comprises multiple independent laser source modules;

each set of the laser source modules comprises plural light sources; the plural light sources are all fabricated by inkjet printing.

As can be seen, it is necessary for inkjet printing to use ink for printing. Corresponding to the laser panel, the ink may comprise a polymer solution doped with laser dyes.

Laser dyes are commonly used dyes known in the art, such as red-emitting hemicyanine dyes, blue-emitting oligostyrene dyes, green-emitting coumarin dyes or rhodamine series of dyes. For example, Coumarin 153, or Coumarin 6 or Rhodamine 6G dye.

Preferred laser dyes are symmetrical diphenylethylene, fluorescein sodium, rhodamine B, and mixtures thereof, more preferably a mixture of the above three dyes.

In another embodiment, a substrate of the laser panel can be used as long as it is beneficial for inkjet printing light sources on it. More preferably, it is necessary for the substrate to have a certain transparency. As an example, the substrate can be selected from any one of the following: (1) a silver mirror substrate coated with magnesium fluoride; (2) a Distributed Bragg Reflector (DBR) substrate, etc.

In another embodiment, at least two of the plural light sources are capable of emitting light in different colors under same excitation conditions.

As for the embodiment, this enables that color mixing in each set of the laser source modules is realized by using at least two light sources. More advantageously, in view of the embodiment in which it can be based on the same excitation conditions, and take the example of exciting the light sources by a femtosecond laser, those skilled in the art can obtain mixed color of at least two light sources only using a single wavelength femtosecond laser. That is, color mixing can be achieved by exiting at least two light sources with one single light beam.

As can be seen, the plural light sources by inkjet printing are all printed with ink. The plural light sources are often microspherical, specifically hemispherical. In the process of fabricating the light sources in the laser panel, the ink used for inkjet printing is liquid, and the fabricated light sources are finally solid, so in the process of inkjet printing, generally, each light source should not contact each other to avoid merging with each other.

In other words, each light source is often not in contact with each other, and there is space between them; if each light source is understood as a hemisphere, for the plural light sources, the first hemisphere and the second hemisphere (even the third hemisphere, etc.) are not tangent to each other.

It can be understood that, during color mixing in at least two light sources, optionally, the at least two light sources are excited by a femtosecond laser, and only a femtosecond laser is used, then the femtosecond laser should be able to excite the at least two light sources at the same time. Thus, because at least two of the plural light sources are capable of emitting light in different colors under same excitation conditions, color mixing in each set of the laser source modules is achieved in the present embodiment. Color mixing is very significant, for example, a variety of different colors can be obtained by mixing colors according to the RGB three primary colors.

It should be pointed out that, the present invention allows that at least two of the plural light sources are capable of emitting light in the same color under the same excitation conditions. For example, to obtain a strong monochromatic light, the plural light sources in each set of the laser source modules may also be the same light sources, which can emit monochromatic light under the same excitation conditions. The laser panel can be used in monochromatic display field.

As noted above, in another embodiment, each set of the laser source modules excites the plural light sources by a femtosecond laser. The femtosecond laser is further described with the following related embodiment.

As can be seen, the parameters of the specific femtosecond laser, such as wavelength, are determined by the light sources themselves formed after the above ink is cured. Being excited by the laser is inevitably related to the absorption spectra of the light sources themselves formed after the ink is cured, i.e., the wavelength herein is determined by the absorption spectra of the light sources formed after the ink is cured.

It is assumed that each set of the laser source modules comprises three light sources, each of which is fabricated by inkjet printing with a specific laser dye, so that: when the three light sources produced with the three dyes can be excited by a same wavelength of laser to emit light, those skilled in the art can choose a laser with this wavelength as the excitation condition; certainly, this does not exclude using a two- or three-wavelength laser as excitation conditions; that is, the wavelength of laser used for excitation can be flexibly selected that: it is possible to select one laser, two lasers or three lasers to excite each set of the laser source modules, and the wavelength of each laser is determined by the absorption spectra of the light sources which is formed after the above ink is cured. In particular, it is different from the prior art, in which multiple light beams in different colors are used for scanning illumination and image display, that the present invention only needs one single laser to excite the light sources.

In another embodiment, the laser panel excites the plural light sources by a DC voltage or a pulse voltage.

For the embodiment, it reveals another excitation way. Certainly, whether it is excited by a femtosecond laser, or a DC voltage or a pulse voltage, depends on the light sources themselves formed after the ink is cured. In other words, the laser dyes obviously have characteristic of being able to be excited by a certain DC voltage or pulse voltage, for example, the DC voltage is about 3V.

In another embodiment, when the laser panel is used for displaying an image, light emitted by each set of the laser source modules under excitation corresponds to one pixel of the image.

For the embodiment, it means that each set of the laser source modules is in pixel level. It is beneficial for achieving finer image display and promoting the application of laser technology in the field of high definition and super definition displays.

In another embodiment, when a DC voltage excitation mode is used, each set of the laser source modules can be driven by thin-film transistors or by other thin-film transistors: for example, oxide semiconductor thin-film transistors, polycrystalline silicon thin-film transistors, amorphous silicon thin-film transistors. Compared with the excitation mode by one or more femtosecond lasers, the DC voltage excitation mode can control each pixel individually, and even simultaneously, which is very beneficial for a pixel-level laser panel. Incidentally, the excitation mode can also significantly reduce the volume of equipment in the field of laser displays. Depending on the materials, DC voltage may be changed to pulse voltage as needed.

In another embodiment, each of the plural light sources is on a millimeter scale, or a micrometer scale or an even smaller scale, such as a nano scale.

For the embodiment, the smaller the scale of each light source, the smaller the scale of each set of the laser source modules, the more favorable it is to achieve the higher-resolution image display effects. If any one of the laser source modules is regarded as a micro-hemisphere structure, according to the resolution requirements, we can produce a micro-hemisphere structure with a size corresponding to the resolution. The size of the micro-hemisphere structure of any one of the light sources may be 15, 35, 45, 85, 100 microns, etc., or even smaller. If the size of the micro-hemisphere structure of any one of the light sources is in the order of millimeters, it is suitable for outdoor large screen display technology.

As can be seen, the optical mode of the micro-hemisphere structure is an echo wall mode. For the different size of the micro-hemisphere structure, the mode spacing is different. According to the theory of the echo wall mode, the smaller the hemisphere diameter is, the larger the mode spacing is, and the less number of modes exist in the gain region. When the number of modes is reduced to one, i.e., the single-mode laser, it can achieve the best monochromaticity.

Furthermore, when the hemisphere diameter of the micro-hemisphere structure corresponding to a light source is reduced to a specific size, and there is a corresponding relationship between the specific size and the light emitted by the light source as a single-mode laser, which can further increase the gamut range of laser. Illustratively rather than restrictively, the specific size is about 15 microns.

In another embodiment, each set of the laser source modules comprises RGB three light sources. Understandably, it is easy to mix colors according to the principle of RGB three primary colors. Referring to the previous text, if a femtosecond laser is used for exciting and mixing colors, the femtosecond laser should be able to excite all RGB three light sources at the same time, so as to use the principle of three primary colors to mix colors to obtain various colors. Similarly, if a DC voltage is used for exciting, more precise control can be achieved: the RGB three light sources can control their voltages individually, thus the three primary colors can be used to mix colors to obtain various colors.

In another embodiment, the ink for inkjet printing comprises a luminescent dye and a matrix material. As an example, a solution is formed by mixing the luminescent dye with a solvent and the matrix material, thus producing the ink.

For the embodiment, because the ink is a liquid, the formulation includes, besides a solvent, mainly a matrix material and a luminescent dye.

It is assumed that in order to produce RGB three primary light sources: preferably, the luminescent dye is selected from rhodamine B, fluorescein sodium, and symmetrical diphenylethylene; Bovine Serum Albumin (BSA) as the matrix material, water as the solvent and glycerol as the auxiliary material.

Wherein, the choice of luminescent dye is very broad. The luminescent dye can be selected from photoinduced laser dyes. For those skilled in the art, according to the requirements of luminescence colors, a dye with a corresponding emission wavelength can be selected. In addition, the luminescent dye can also be selected from blue-emitting oligostyrene dyes, or green-emitting coumarin dyes such as coumarin 153, or coumarin 6, etc., or rhodamine series of dyes such as rhodamine 6G, etc., or red-emitting hemicyanine dyes. More generally, the luminescent dye can also be selected from electroluminescent laser dyes. Being excited by voltage is inevitably related to the electroluminescent spectra of the light sources themselves formed after the ink is solidified. A specific voltage value (or value range) is determined by the electroluminescent properties.

As an example, the matrix material is used as a support material for the laser cavity, which is compatible with the laser dyes. Understandably, the better the material compatibility, the more suitable it is to be used as a matrix material. As can be seen, if the matrix material has good processability, it is also very advantageous. For example, the matrix material can be selected from the materials such as polystyrene, polymethyl methacrylate, NOA series of light curable materials such as NOA1625, NOA68, etc.

More preferably, besides water, the solvent can also be selected from dichloromethane, chloroform, dimethylformamide and so on.

In addition, principle for selection of the auxiliary material is that: on one hand it helps to reduce the volatility of the solvent; and on the other hand ensures that the ink is not solidified in the printing process. For example, the auxiliary material is generally selected from liquid polymer prepolymer, which is solidified only after light or heat treatment. Moreover, the auxiliary material is also selected from heat curable epoxy resins and NOA series of light curable adhesives, etc.

More preferable, the specific formulation can be any one of the following:

Three laser dyes, symmetrical diphenylethylene, fluorescein sodium and rhodamine B, are added into a BSA aqueous solution of 300-1000 mg/mL respectively, in which a mass ratios of the three dyes to BSA are 1-3%, respectively, and then glycerol is added. A volume ratio of glycerol to water is 1:1-4, preferably 1:2.

More preferable, the ink can be any one of the following formulations:

(1) Three laser dyes, namely symmetrical diphenylethylene, fluorescein sodium and rhodamine B, are added into a BSA aqueous solution of 400 mg/mL, respectively, in which the mass ratios of any one of the three dyes to BSA are all 1%. Finally, glycerol is added, in which the volume ratio of glycerol to water is 1:2.

(2) Three laser dyes, namely symmetrical diphenylethylene, fluorescein sodium and rhodamine B, are added into a BSA aqueous solution of 800 mg/mL, respectively, in which the mass ratios of any one of the three dyes to BSA are all 1%. Finally, glycerol is added, in which the volume ratio of glycerol to water is 1:2.

(3) Three laser dyes, namely symmetrical diphenylethylene, fluorescein sodium and rhodamine B, are added into a BSA aqueous solution of 500 mg/mL, respectively, in which the mass ratios of diphenylethylene, fluorescein sodium and rhodamine B to BSA are 2%, 2%, and 1%, respectively. Finally, glycerol is added, in which the volume ratio of glycerol to water is 1:2.

(4) In addition to the dosage of the above specific formulations, there are still many choices, of which the concentration range of BSA aqueous solution is 300-1000 mg/mL. The mass ratios of rhodamine B, fluorescein sodium and symmetrical diphenylethylene to BSA are 1%-2%, 1%-3% and 1%-3%, respectively. The volume ratio of glycerol to water is 30%-100%.

In another embodiment, when the above formulations (1) to (3) is used, each set of the laser source modules in the laser panel is excited by 335-375 nm femtosecond lasers to emit light. As previously described, the wavelength is determined by the absorption spectra.

In another embodiment, sizes of the printheads are determined by a size of each light source.

As can be seen, the sizes of the printheads are related to the hemisphere diameter of the above-described micro-hemisphere structure and are determined by the hemisphere diameter. The sizes of the printheads can be selected in a range of 5, 10, 20, 30, 40, 50, 60 microns, etc. If it is necessary to produce a micro-hemisphere structure smaller than micronscale, when the sizes of the printheads cannot be smaller, an inkjet printer capable of adjusting a size of ink droplets can be used and adaptively slightly improved to produce the light sources of the present invention by inkjet printing. As mentioned earlier, in order to obtain a millimeter-scale micro-hemisphere structure, sizes of the printheads can be appropriately larger.

An inkjet printer capable of adjusting the size of ink droplets can refer to the following patent documents in the prior art: CN1876375 A, U.S. Pat. No. 8,042,899 B2, U.S. Pat. No. 8,714,692 B1, U.S. Pat. No. 8,955,937 B2, U.S. Pat. No. 8,985,723 B2, U.S. Pat. No. 9,573,382 B1. These patent documents are here introduced in the description of the present invention, but it should be pointed out that these are only part of the related technologies of inkjet printers in the prior art. Since it is impossible to exhaust all technologies in the prior art, the remaining existing technologies that can be referred to and slightly improved are not listed.

Referring to FIG. 1, in one embodiment of the present invention, a laser array device is shown, wherein, the laser array device comprises multiple independent laser source modules; each set of the laser source modules comprises plural light sources; the plural light sources are all fabricated by inkjet printing.

For the embodiment, firstly, it realizes that a laser array device is fabricated by inkjet printing, which provides a new technical solution for cheap and industrial manufacturing of laser array devices; secondly, since the laser array device comprises multiple independent laser source modules, each set of the laser source modules are independent of each other when emitting light, among which it is difficult to generate laser coherent superposition, thereby significantly eliminating common speckle phenomena caused by laser coherence.

As can be seen, it is necessary for inkjet printing to use ink for printing. Corresponding to the laser array device, the ink can be a polymer solution doped with laser dyes.

In another embodiment, at least two of the plural light sources are capable of emitting light in different colors under same excitation conditions.

As for the embodiment, this enables that color mixing in each set of the laser source modules is realized with at least two light sources. More advantageously, in view of the embodiment in which it can be based on the same excitation conditions, and take the example of exciting the light sources by a femtosecond laser, those skilled in the art can obtain mixed color of at least two light sources only using a single wavelength femtosecond laser. That is, color mixing can be achieved by exiting at least two light sources with one single light beam.

As can be seen, the plural light sources by inkjet printing are all printed with ink, which are often microspherical, preferably hemispherical. In the process of producing the light sources in the laser panel, the ink used for inkjet printing is liquid, and the produced light sources are finally solid, so in the process of inkjet printing, generally, each light source should not contact each other to avoid merging with each other.

In other words, each light source is often not in contact with each other, and there is space between them; if each light source is understood as a hemisphere, for the plural light sources, the first hemisphere and the second hemisphere (even the third hemisphere, etc.) are not tangent to each other.

Understandably, during color mixing in at least two light sources, optionally, the at least two light sources are excited by a femtosecond laser, and only one femtosecond laser is used, then the femtosecond laser should be able to excite the at least two light sources at the same time. Thus, because at least two of the plural light sources are capable of emitting light in different colors under same excitation conditions, color mixing in each set of the laser source modules is achieved in the present embodiment. Color mixing is very significant, for example, a variety of different colors can be obtained by mixing colors according to the RGB three primary colors.

In particular, the present invention allows that at least two of the plural light sources are capable of emitting light in the same color under the same excitation conditions. For example, to obtain a strong monochromatic light, the plural light sources in each set of the laser source modules may also be the same light source, which can emit light in the same color under the same excitation conditions. The laser source array can be used in the field of searchlights.

As noted above, in another embodiment, each set of the laser source modules excites the plural light sources by a femtosecond laser. The femtosecond laser is further described with the following related embodiment.

As can be seen, the parameters of the specific femtosecond laser, such as wavelength, are determined by the light sources themselves formed after the above ink is cured. Being excited by the laser is inevitably related to the absorption spectra of the light sources themselves formed after the ink is solidified, i.e., the wavelength herein is determined by the absorption spectra of the light sources formed after the ink is cured.

It is assumed that each set of the laser source modules comprises three light sources, each of which is fabricated by inkjet printing with a specific laser dye, so that: when the three light sources produced with the three dyes can be excited by the same wavelength of laser to emit light, those skilled in the art can choose a laser with this wavelength as the excitation condition; certainly, this does not exclude using a two- or three-wavelength laser as excitation conditions; that is, the wavelength of laser used for excitation can be flexibly selected that: it is possible to select one laser, two lasers or three lasers to excite each set of the laser source modules, and the wavelength of each laser is determined by the absorption spectra of the light sources is cured. In particular, it is different from the prior art, in which multiple light beams in different colors are used for scanning illumination and image display, that the present invention only needs to use a laser to excite the light sources.

In another embodiment, the laser array device excites the plural light sources by DC voltage.

For the embodiment, it reveals another excitation way. Certainly, whether it is excited by a femtosecond laser, or DC voltage or pulse voltage, it depends on the light sources themselves formed after the ink is cured. In other words, the laser dyes obviously have characteristic of being able to be excited by a certain DC voltage or pulse voltage, for example, the DC voltage is about 3V.

In another embodiment, when the laser array device is used for displaying an image, the light emitted by each set of the excited laser source modules corresponds to one pixel of the image.

For the embodiment, it means that each set of the laser source modules is in pixel level. It is beneficial for achieving finer image display and promoting the application of laser technology in the field of high definition and super definition displays.

In another embodiment, when a DC voltage excitation mode is used, each set of the laser source modules can be driven by thin-film transistors or by other thin-film transistors: for example, oxide semiconductor thin-film transistors, polycrystalline silicon thin-film transistors, amorphous silicon thin-film transistors. Compared with the excitation mode by one or more femtosecond lasers, the DC voltage excitation mode can control each pixel individually, and even simultaneously, which is very beneficial for a pixel-level laser array device. Incidentally, the excitation mode can also significantly reduce the volume of equipment in the field of laser displays. Depending on the materials, DC voltage may be changed to pulse voltage as needed. The pulse frequency and amplitude can match the refresh rate required for display.

In addition, in another embodiment of the present invention, it also provides a laser projector, wherein, the laser projector comprises any of the preceding items of the laser array device.

In addition, the present invention also provides a laser film, wherein, the laser film comprises any of the preceding items of the laser array device.

For the laser projector and the laser film, the applications of the laser array device of the present invention are expanded. For example, the laser array device is used as a light source in a projector. In general, the inkjet printing process depends on a substrate, as long as it is beneficial for inkjet printing light sources on the substrate; more preferably, it is necessary for the substrate to have a certain transparency. Understandably, when used for the laser film, the substrate of the laser array device is required to have corresponding flexibility.

Referring to (b) and (c) in FIG. 1, in an embodiment of the present invention, a panel that is a core component of a laser display is shown. Combined with FIG. 1, in an embodiment of the present invention a laser display is disclosed, wherein, the laser display includes a laser panel; the laser panel comprises multiple independent laser source modules;

each set of the laser source modules comprises plural light sources; the plural light sources are all fabricated by inkjet printing.

As for the embodiment: firstly, it realizes that a panel that is a core component of a laser display is fabricated by inkjet printing, which provides a new technical solution for cheap and industrial manufacturing of laser displays; secondly, since the laser panel comprises multiple independent laser source modules, each set of the laser source modules can be independent of each other when emitting light, among which it is difficult to generate laser coherent superposition, thereby significantly eliminating common speckle phenomena caused by laser coherence.

As can be seen, it is necessary for inkjet printing to use ink for printing. Corresponding to the laser panel, the ink can be a polymer solution doped with laser dyes.

In another embodiment, at least two of the plural light sources are capable of emitting light in different colors under the same excitation conditions.

As for the embodiment, this enables that color mixing in each set of the laser source modules is realized with at least two light sources. More advantageously, in view of the embodiment in which it can be based on the same excitation conditions, and take the example of exciting the light sources by a femtosecond laser, those skilled in the art can obtain mixed color of at least two light sources only using a single wavelength femtosecond laser. That is, color mixing can be achieved by exiting at least two light sources with one single light beam.

As can be seen, the plural light sources by inkjet printing are all printed with ink, which are often microspherical, specifically hemispherical. In the process of producing the light sources, the ink used for inkjet printing is liquid, and the produced light sources are finally solid, so in the process of inkjet printing, generally, each light source should not contact each other to avoid merging with each other.

In other words, each light source is often not in contact with each other, and there is space between them; if each light source is understood as a hemisphere, for the plural light sources, the first hemisphere and the second hemisphere (even the third hemisphere, etc.) are not tangent to each other.

Understandably, during color mixing in at least two light sources, optionally, the at least two light sources are excited by a femtosecond laser, and only a beam of femtosecond laser is used, then the beam of femtosecond laser should be able to excite the at least two light sources at the same time. Thus, because at least two of the plural light sources are capable of emitting light in different colors under the same excitation conditions, color mixing in each set of the laser source modules is achieved in the embodiment. Color mixing is very significant, for example, a variety of different colors can be obtained by mixing colors according to the RGB three primary colors.

In particular, the present invention allows that at least two of the plural light sources are capable of emitting light in the same color under same excitation conditions. For example, to obtain a strong monochromatic light, the plural light sources in each set of the laser source modules may also be the same light source, which can emit light in the same color under the same excitation conditions. The laser display can be used in the field of monochromatic displays.

As noted above, in another embodiment, each set of the laser source modules excites the plural light sources by a femtosecond laser. The femtosecond laser is further described with the following related embodiments.

As can be seen, the parameters of the specific femtosecond laser, such as wavelength, are determined by the light sources themselves formed after the above ink is cured. Being excited by the laser is inevitably related to the absorption spectra of the light sources themselves formed after the ink is cured, i.e., the wavelength herein is determined by the absorption spectra of the light sources formed after the ink is cured.

Assuming that each set of the laser source modules comprises three light sources, each of which is fabricated by inkjet printing with a specific laser dye, so that: when the three light sources produced with the three dyes can be excited by the same wavelength of laser to emit light, those skilled in the art can choose a laser with this wavelength as the excitation condition; certainly, this does not exclude using a two- or three-wavelength laser as excitation conditions; that is, the wavelength of laser used for excitation can be flexibly selected that: it is possible to select one laser, two lasers or three lasers to excite each set of the laser source modules, and the wavelength of each laser is determined by the absorption spectra of the light sources which is formed after the above ink is cured. In particular, it is different from the prior art, in which multiple light beams in different colors are used for scanning illumination and image display, that the present invention only needs to use a beam of laser to excite the light sources.

In another embodiment, the laser display includes not only the aforementioned laser panel and the laser transmitter, but also a rotatable reflector, a scan controller and a signal input unit;

when the laser transmitter emits light, only one beam of femtosecond laser is emitted, projected onto the rotatable reflector, and reflected onto the laser panel to excite the laser source through the rotatable reflector;

the signal input unit is used for inputting the digital image signal to be displayed and outputting the control signal to a scan controller; the scan controller controls the rotation of the rotatable reflector according to the received control signal, so that the beam of femtosecond laser can excite the corresponding laser source.

For the above embodiments, furthermore, the present invention can use any suitable scanning method in the existing laser display, but it may be worth noting that the present invention can only use one beam of femtosecond laser.

In another embodiment, the laser display excites the plural light sources by a DC voltage or a pulse voltage.

The present embodiment reveals another excitation way. Certainly, whether it is excited by a femtosecond laser, or a DC voltage or a pulse voltage, it depends on the light sources themselves formed after the ink is cured. In other words, the laser dyes obviously have characteristic of being able to be excited by a certain DC voltage or a pulse voltage, for example, the DC voltage is about 3V.

In another embodiment, when the laser display is used for displaying an image, the light emitted by each set of the excited laser source modules corresponds to one pixel of the image.

For the embodiment, it means that each set of the laser source modules is in pixel level. It is beneficial for achieving finer image display and promoting the application of laser technology in the field of high definition and super definition displays.

In another embodiment, when a DC voltage excitation mode is used, each set of the laser source modules can be driven by thin-film transistors or by other thin-film transistors: for example, oxide semiconductor thin-film transistors, polycrystalline silicon thin-film transistors, amorphous silicon thin-film transistors. Compared with the excitation mode by one or more beam of femtosecond laser, the DC voltage excitation mode can control each pixel individually, and even simultaneously, which is very beneficial for a pixel-level laser display. Incidentally, the excitation mode can also significantly reduce the volume of equipment in the field of laser displays. Depending on the materials, DC voltage may be changed to pulse voltage as needed. The pulse frequency and amplitude can match the refresh rate required for display.

In one embodiment of the present invention, a voltage-driven laser display is disclosed. (b) and (c) in FIG. 1 show a schematic view of a panel that is the core component. For the laser display, wherein, the laser display comprises a laser panel;

the laser panel comprises multiple independent laser source modules;

each set of the laser source modules comprises plural light sources;

the plural light sources are all fabricated by inkjet printing, and can be excited by DC voltage or pulse voltage.

For the embodiment, firstly, it realizes that a panel that is a core component of a laser display is fabricated by inkjet printing, which provides a new technical solution for cheap and industrial manufacturing of laser displays; secondly, since the laser panel comprises multiple independent laser source modules, each set of the laser source modules are independent of each other when emitting light, among which it is difficult to generate laser coherent superposition, thereby significantly eliminating common speckle phenomena caused by laser coherence; moreover, because the plural light sources can be excited by DC voltage or pulse voltage, the embodiment can realize a laser display with smaller volume.

In another embodiment, for each of the plural light sources, it is independently controlled by the corresponding driving unit.

In the present embodiment, when a DC voltage excitation mode is used, each set of the laser source modules, and even each light source among them, can be driven by thin-film transistors or by other thin-film transistors: for example, oxide semiconductor thin-film transistors, polycrystalline silicon thin-film transistors, amorphous silicon thin-film transistors. Compared with the excitation mode by one or more beam of femtosecond lasers, when each light source is controlled individually, and even simultaneously, it is very beneficial for a pixel-level laser display, and helpful to improve the display effects comprehensively. It should be noted that the driving mode is related to a substrate. What kind of specific driving mode is used corresponds to the corresponding and optional substrate.

As can be seen, it is necessary for inkjet printing to use ink for printing. Corresponding to the laser panel, the ink can be a polymer solution doped with laser dyes.

In another embodiment, the substrate of the panel that is a core component of a laser display can be selected as long as it is beneficial for inkjet printing light sources on it. More preferably, it is necessary for the substrate to have a certain transparency. Understandably, in order to realize voltage driving, the active matrix structure or passive matrix structure is adopted in the substrate. As an example, for example, a backplane including a polycrystalline silicon field effect transistor or a thin-film transistor structure is adopted. As described in the above embodiments, the driving mode is related to the substrate. What kind of specific driving mode is used corresponds to the corresponding and optional substrate.

In another embodiment, at least two of the plural light sources are capable of emitting light in different colors under the same excitation conditions.

As for the embodiment, this enables that color mixing in each set of the laser source modules is realized with at least two light sources. More advantageously, in view of the embodiments in which it can be based on the same excitation conditions, those skilled in the art can obtain color mixing with at least two light sources only by using voltage driving with an appropriate range of voltages. That is, by using voltage driving with an appropriate range of voltages, at least two light sources can be excited to achieve color mixing.

As can be seen, the plural light sources by inkjet printing are all printed with ink, which are often microspherical, specifically hemispherical. In the process of producing the light sources, the ink used for inkjet printing is liquid, and the produced light sources are finally solid, so in the process of inkjet printing, generally, each light source should not contact each other to avoid merging with each other.

In other words, each light source is often not in contact with each other, and there is space between them; if each light source is understood as a hemisphere, for the plural light sources, the first hemisphere and the second hemisphere (even the third hemisphere, etc.) are not tangent to each other.

Because at least two of the plural light sources are capable of emitting light in different colors under the same excitation conditions, color mixing in each set of laser source modules is easily achieved in the embodiment. Color mixing is very significant, for example, a variety of different colors can be obtained by mixing colors according to the RGB three primary colors. For all of these, it only needs to be driven by DC voltage or pulse voltage, and at least three light sources in each set of the laser source modules can emit light in RGB three primary colors.

In particular, the present invention allows that at least two of the plural light sources are capable of emitting light in the same color under the same excitation conditions. For example, to obtain a strong monochromatic light, the plural light sources in each set of the laser source modules may also be the same light source, which can emit light in the same color under the same excitation conditions. The laser display can be used in the field of monochromatic displays.

The voltage-driven laser display is further described with the following related embodiment.

As can be seen, the specific voltage-driven parameters, such as voltage value or value range, are determined by the light sources themselves formed after the above ink of the laser dyes is cured. Being excited by voltage is inevitably related to the electroluminescent properties of the laser dye ink itself.

Assuming that each set of the laser source modules comprises three light sources, each of which is fabricated by inkjet printing with a specific laser dye, so that: when the three light sources produced with the three dyes can be excited by voltages within the same value range, those skilled in the art can choose the voltages within the value range as the excitation conditions; certainly, this does not exclude using voltages of two or three specific values as the excitation conditions; that is, the DC voltage used for excitation can be selected flexibly as long as it meets industrial needs and enables the light sources to produce electroluminescence: as a consequence of this, it is all right to choose one voltage value (or value range), two or more. Thus, it is different from the prior art, in which multiple light beams in different colors are used for scanning illumination and image display, that the present invention can flexibly use a DC voltage or a pulse voltage to excite the light sources. Depending on the materials, DC voltage may be changed to pulse voltage as needed. The pulse frequency and amplitude can match the refresh rate required for display.

Obviously, the laser dyes should have the characteristics that they can be excited by a certain DC voltage, for example, the DC voltage is about 3V.

In another embodiment, when the laser display is used for displaying an image, the light emitted by each set of the excited laser source modules corresponds to one pixel of the image.

In the present embodiment, it means that each set of the laser source modules is in pixel level. It is beneficial for achieving finer image display and promoting the application of laser technology in the field of high definition and super definition displays.

In another embodiment, each set of the laser source modules includes RGB three light sources. Understandably, it is easy to mix colors according to the principle of RGB three primary colors. As previously described, if a DC voltage is used for exciting, more precise control can be achieved: for RGB three light sources it can control voltages separately, thus using the principle of three primary colors to mix colors to obtain various colors.

In another embodiment, the ink for inkjet printing comprises a luminescent dye and a matrix material. As an example, a solution is formed by mixing the luminescent dye with a solvent and the matrix material, thus producing the ink.

For the embodiment, because the ink is liquid, the formulation, besides a solvent, mainly includes a matrix material and a luminescent dye.

It is assumed to produce light sources of RGB three primary colors: preferably, the luminescent dye is selected from $CH_3NH_2PbBr_3$, $CH_3NH_2PbCl_3$, and $CH_3NH_2PbI_3$, etc. The conductive material is polyethylene oxide (PEO) and the solvent is dimethylformamide (DMF).

More preferable, the specific formulation can be any one of the following:

(1) 10 mg of $CH_3NH_2PbBr_3$, $CH_3NH_2PbCl_3$, and $CH_3NH_2PbI_3$ are added into 1 mL DMF solution, respectively, and then 10 mg of PEO is added to obtain a printing ink.

(2) 20 mg of $CH_3NH_2PbBr_3$, $CH_3NH_2PbCl_3$, and $CH_3NH_2PbI_3$ are added into 1 mL DMF solution, respectively, and then 15 mg of PEO is added to obtain a printing ink.

(3) 40 mg of $CH_3NH_2PbBr_3$, $CH_3NH_2PbCl_3$, and $CH_3NH_2PbI_3$ are added into 1 mL DMF solution, respectively, and then 20 mg of PEO is added to obtain a printing ink.

(4) In addition to the above formulations, there are still many choices. The concentration range of $CH_3NH_2PbBr_3$, $CH_3NH_2PbCl_3$, and $CH_3NH_2PbI_3$ is between 10 mg/mL and 40 mg/mL, and a mass ratio of PEO to perovskite is between 1:1 and 1:2.

In another embodiment, when the above formulations (1) to (3) are used, each set of the laser source modules in the laser display is excited by a certain DC voltage to emit light. As previously described, the voltage is determined by the inherent characteristics of an ink formulation.

In another embodiment, the plural light sources in a laser panel, or a laser array, or a panel of a laser display, or a voltage-driven panel of a laser display are all fabricated by inkjet printing. The inkjet printing is performed using one or more printheads; the printheads are used for sequentially printing, or printing at a time each light source in each set of the laser source modules.

Figure 2:
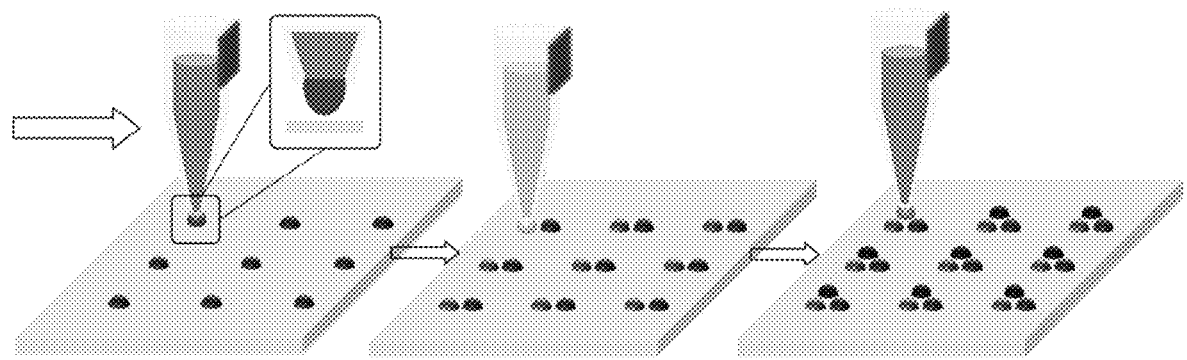
FIG. 2 is a schematic view of the inkjet printing process of a laser panel or a laser array device in an embodiment of the present invention.
Figure 3:
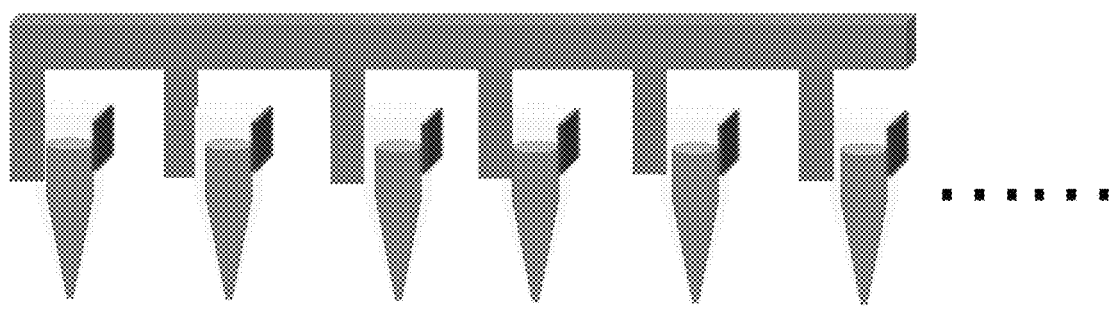
FIG. 3 is another schematic view of the inkjet printing process of a laser panel or a laser array device in an embodiment of the present invention.

For the embodiment, referring to FIG. 2, when using one printhead, the printhead prints each light source in each set of the laser source modules sequentially, for instance, successively printing three light sources, red, green and blue in the order of R, G and B; when using multiple printheads, each light source in each set of the laser source modules can be printed at one time by the multiple printheads. Understandably, the number of the printheads in work should be larger than or equal to the number of the light sources in each set of the laser source modules, for example, larger than or equal to the number of RGB three light sources. FIG. 3 only shows multiple printheads for a certain light source, such as multiple printheads for a red light source, and other light sources for the plural light sources are not shown.

In the above embodiments, the description of every embodiment has its own emphasis, and the parts that are not described in detail in some embodiment can be referred to the related descriptions of other embodiments.

As described above, the above embodiments are only used to illustrate the technical solutions of the present invention, rather than limiting the present invention; although the present invention is described in detail with reference to the above embodiments, it should be understood for those skilled in the art that the technical solutions described in the embodiments can be modified, or some of the technical features can be equivalently alternated; and the modifications or equivalents do not make the essence of the corresponding technical solutions depart from the scope of the technical solutions of every embodiment of the present invention.

The invention claimed is:

1. A laser panel, comprising:
a plurality of laser source modules, and
each laser source module comprises a plurality of light sources printed by inkjet printing using an ink, and the plurality of light sources are excited by a femtosecond laser.

2. The laser panel according to claim 1, wherein at least two of the plurality of light sources emit lights of different colors by a same femtosecond laser.

3. The laser panel of claim 1, wherein, when the laser panel displays an image, light emitted by each laser source module under excitation corresponds to one pixel of the image.

4. The laser panel of claim 1, wherein the plurality of light sources are RGB light sources.

5. The laser panel of claim 1, wherein the ink comprises a luminescent dye and a matrix material.

6. A device, comprising:
a plurality of laser source modules, each laser source module comprising a plurality of light sources that are printed by inkjet printing using an ink and a femtosecond laser that excites the plurality of light sources.

7. The device according to claim 6, wherein at least two of the plurality of light sources emit lights of two different colors by a same femtosecond laser.

8. A laser projector, wherein the laser projector comprises the device according to claim 6.

9. A laser film, wherein the laser film comprises the device according to claim 6.

10. The device of claim 6, wherein each light source is on a millimeter scale or a micrometer scale.

11. The device of claim 6, wherein the plurality of light sources are RGB light sources.

12. The device of claim 6, wherein the ink comprises a luminescent dye and a matrix material.

13. A laser display, comprising a laser panela, wherein the laser panel comprises a plurality of laser source modules, and each laser source module comprises a plurality of light sources printed by inkjet printing using an ink, and the plurality of light sources are excited by a femtosecond laser.

14. The laser display according to claim 13, wherein at least two of the plurality of light sources emit lights of two different colors by a same femtosecond laser.

15. The laser display of claim 13, wherein, when the laser panel displays an image, light emitted by each laser source module under excitation corresponds to one pixel of the image.

16. The laser display of claim 13, wherein the plurality of light sources are RGB light sources.

17. A voltage-driven laser display, comprising a laser panel,
wherein the laser panel comprises a plurality of laser source modules,
each laser source module comprises a plurality of light sources
by inkjet printing using an ink, and is excitable by a DC voltage or a pulse voltage.

18. The voltage-driven laser display according to claim 17, wherein at least two of the plurality of sources emit lights of different colors when excited by a same DC voltage or a same pulse voltage.

19. The voltage-driven laser display according to claim 17, wherein the DC voltage is about 3V and the pulse voltage has a pulse frequency and an amplitude that match a refresh rate required for display.

20. The voltage-driven laser display according to claim 17, wherein, when the laser display displays an image, light emitted by each laser source module under excitation corresponds to one pixel of the image.

* * * * *